United States Patent
Huang et al.

(10) Patent No.: US 11,088,541 B2
(45) Date of Patent: Aug. 10, 2021

(54) INTEGRATED CIRCUIT AND ELECTROSTATIC DISCHARGE PROTECTION CIRCUIT THEREOF

(71) Applicant: Vanguard International Semiconductor Corporation, Hsinchu (TW)

(72) Inventors: Shao-Chang Huang, Hsinchu (TW); Jia-Rong Yeh, Taipei (TW); Yeh-Ning Jou, Hsinchu (TW); Hsien-Feng Liao, Taichung (TW); Yi-Han Wu, Taichung (TW); Chih-Cherng Liao, Jhudong Township (TW); Chieh-Yao Chuang, Kaohsiung (TW); Wei-Shung Chen, Jhubei (TW); Ching-Wen Chen, Taichung (TW); Pang-Chuan Chen, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 320 days.

(21) Appl. No.: 16/124,765

(22) Filed: Sep. 7, 2018

(65) Prior Publication Data
US 2020/0083704 A1  Mar. 12, 2020

(51) Int. Cl.
*H02H 9/04* (2006.01)
*H02H 1/00* (2006.01)
(Continued)

(52) U.S. Cl.
CPC ......... *H02H 9/046* (2013.01); *H01L 27/0266* (2013.01); *H02H 1/0007* (2013.01); *H01L 27/0629* (2013.01); *H01L 27/092* (2013.01)

(58) Field of Classification Search
CPC ........ H02H 9/046; H02H 1/0007; H02H 3/20; H01L 27/0266; H01L 27/0629
See application file for complete search history.

(56) References Cited

U.S. PATENT DOCUMENTS

| 7,911,752 B1* | 3/2011 | Lin | ...................... H02H 9/046 361/56 |
| 2010/0039743 A1 | 2/2010 | Lin et al. | |

(Continued)

FOREIGN PATENT DOCUMENTS

| CN | 101938118 A | 1/2011 |
| CN | 106786455 A | 5/2017 |

(Continued)

OTHER PUBLICATIONS

Chinese Office Action and Search Report for Chinese Application No. 201810477845.8, dated May 7, 2021.

*Primary Examiner* — Scott Bauer
(74) *Attorney, Agent, or Firm* — Birch, Stewart, Kolasch & Birch LLP

(57) ABSTRACT

An electrostatic discharge protection circuit is provided. The electrostatic discharge protection circuit includes an electrostatic discharge detection circuit, a discharge circuit, and a switch. The electrostatic discharge detection circuit detects whether an electrostatic discharge event occurs at the bounding pad to generate a first detection circuit. The discharge circuit receives the first detection signal. When the electrostatic discharge event occurs at the bounding pad, the discharge circuit provides a discharge path between the bounding pad and a ground terminal according to the first detection signal. The switch is coupled between the core circuit and the ground terminal and controlled by the first detection signal. When the electrostatic discharge event occurs at the bounding pad, the switch is turned off according to the first detection signal.

15 Claims, 8 Drawing Sheets

(51) Int. Cl.
*H01L 27/02* (2006.01)
*H01L 27/092* (2006.01)
*H01L 27/06* (2006.01)

(56) References Cited

U.S. PATENT DOCUMENTS

| | | | | |
|---|---|---|---|---|
| 2011/0063762 A1* | 3/2011 | Lee | ............... | H02H 9/046 |
| | | | | 361/56 |
| 2015/0214732 A1* | 7/2015 | Haruki | ............... | H02H 9/042 |
| | | | | 361/56 |

FOREIGN PATENT DOCUMENTS

| | | |
|---|---|---|
| CN | 107204610 A | 9/2017 |
| TW | 201707184 A | 2/2017 |
| TW | 201810949 A | 3/2018 |

* cited by examiner

INTEGRATED CIRCUIT AND ELECTROSTATIC DISCHARGE PROTECTION CIRCUIT THEREOF

BACKGROUND OF THE INVENTION

Field of the Invention

The invention relates to an integrated circuit, and, more particularly, to an integrated circuit with an electrostatic discharge protection circuit.

Description of the Related Art

In the development of the semiconductor manufacturing process, the dimensions of semiconductor elements have reached the sub-micron level, upgrading the performance and computational speed of integrated circuits. As dimensions shrink, the reliability and capability of electrostatic discharge (ESD) protection of integrated circuits decline significantly. When the dimensions are reduced with the developed manufacture process, the capability of ESD protection is seriously lowered, which causes the ESD tolerance of the elements to become degraded. Thus, an ESD protection circuit is provided to provide a discharge path for electrostatic charges. Particularly, how an ESD protection circuit can quickly provide a discharge path is an important issue.

BRIEF SUMMARY OF THE INVENTION

An exemplary embodiment of an electrostatic discharge protection circuit is provided. The electrostatic discharge protection circuit comprises an electrostatic discharge detection circuit, a discharge circuit, and a switch. The electrostatic discharge detection circuit detects whether an electrostatic discharge event occurs at the bounding pad to generate a first detection circuit. The discharge circuit receives the first detection signal. When the electrostatic discharge event occurs at the bounding pad, the discharge circuit provides a discharge path between the bounding pad and a ground terminal according to the first detection signal. The switch is coupled between the core circuit and the ground terminal and controlled by the first detection signal. When the electrostatic discharge event occurs at the bounding pad, the switch is turned off according to the first detection signal.

In an embodiment, the switch comprises an N-type transistor which has a first terminal coupled to the core circuit, a second terminal coupled to the ground terminal, and a control terminal receiving the first detection signal.

In another embodiment, the electrostatic discharge protection circuit further comprises a first P-type transistor which has a first terminal coupled to the bounding pad, a second terminal coupled to the core circuit, and a control terminal. When the core circuit does not operate in a normal operation mode, the control terminal of the first P-type transistor is in a floating state.

An exemplary embodiment of an integrated circuit is provided. The integrated circuit comprises a core circuit and an electrostatic discharge protection circuit. The core circuit is coupled to a bounding pad. The core circuit further has a power terminal coupled to a ground terminal. The electrostatic discharge protection circuit is coupled to the bounding pad and the core circuit. When an electrostatic discharge event occurs at the bounding pad, the electrostatic discharge protection circuit provides a discharge path between the bounding pad and the ground terminal and blocks a current path between the power terminal the ground terminal. The electrostatic discharge protection circuit comprises an electrostatic discharge detection circuit, a discharge circuit, and a first N-type transistor. The electrostatic discharge detection circuit detects whether the electrostatic discharge event occurs at the bounding pad to generate a first detection circuit. The discharge circuit receives the first detection signal. When the electrostatic discharge event occurs at the bounding pad, the discharge circuit provides the discharge path according to the first detection signal. The first N-type transistor has a first terminal coupled to the core circuit, a second terminal coupled to the ground terminal, and a control terminal receiving the first detection signal. When the electrostatic discharge event occurs at the bounding pad, the first N-type transistor is turned off according to the first detection signal to block the current path.

In an exemplary embodiment, the electrostatic discharge protection circuit further comprises a first P-type transistor which has a first terminal coupled to the bounding pad, a second terminal coupled to the core circuit, and a control terminal. when the core circuit does not operate in a normal operation mode, the control terminal of the first P-type transistor is in a floating state.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
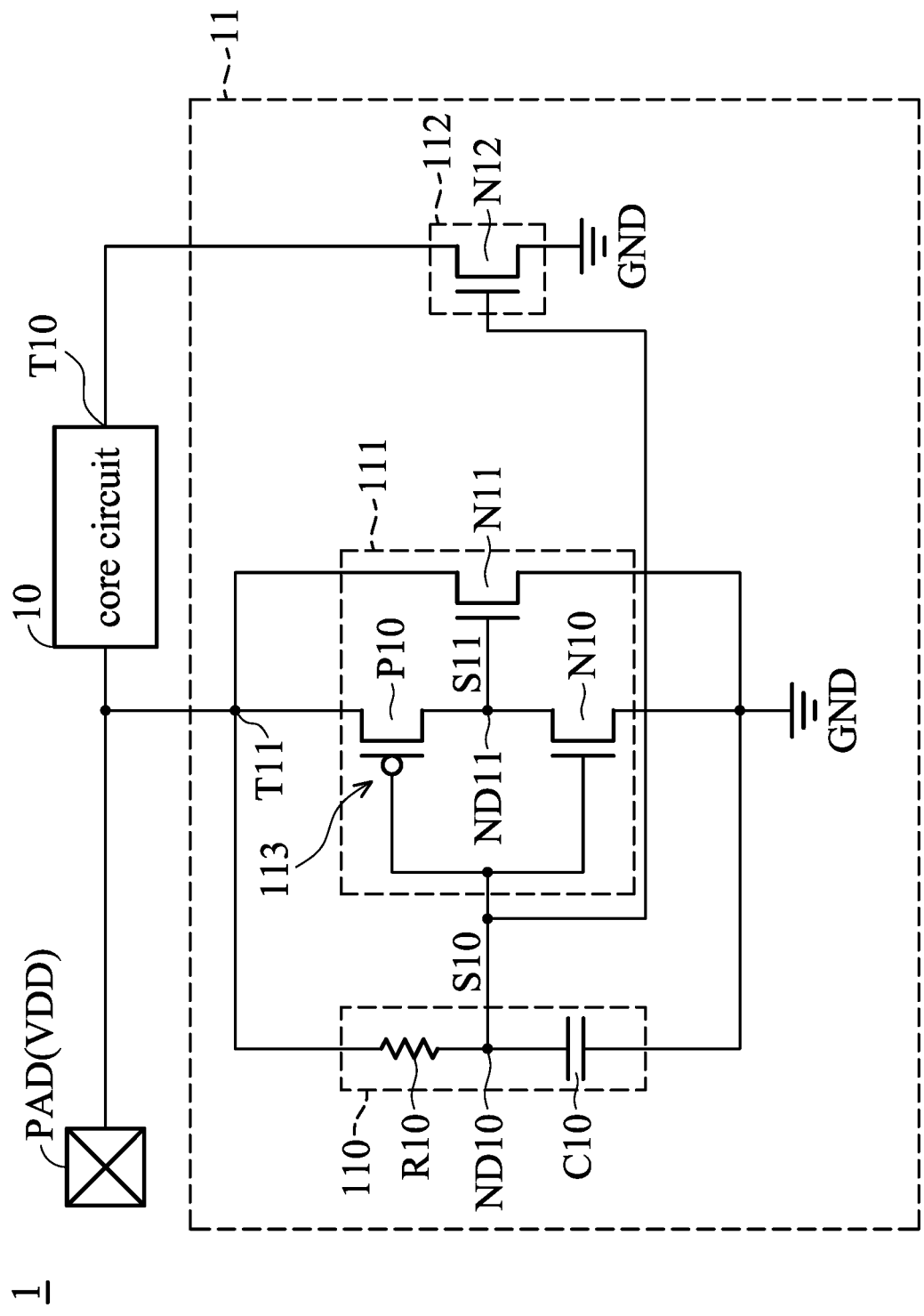
FIG. 1 shows one exemplary embodiment of an electrostatic discharge (ESD) protection circuit applied in an integrated circuit.

FIG. 1 shows an exemplary embodiment of an integrated circuit. Referring to FIG. 1, an integrated circuit 1 comprises a core circuit 10, an electrostatic discharge (ESD) protection circuit 11, and a bonding pad PAD. The electrostatic discharge protection circuit 11 comprises an electrostatic discharge detection circuit 110, a discharge circuit 111, a switch 112, and a power terminal T11. The electrostatic discharge protection circuit 11 is coupled to the bonding pad PAD through the power terminal T11. The core circuit 10 is coupled to the bonding pad PAD. In an embodiment, the core circuit 10 comprises at least one one-time programmable (OTP) element. The power terminal T10 of the core circuit 10 is coupled to a ground terminal GND through the switch 112. When the core circuit 10 operates in a normal operation mode, an operation voltage VDD is supplied to the bonding pad PAD; and when the core circuit 10 does not operate in the normal operation mode, the bonding pad PAD does not receive the operation voltage VDD. The electrostatic discharge detection circuit 110 is coupled to the bonding pad PAD. During the period when the core circuit 10 does not operate in the normal operation mode, the electrostatic discharge detection circuit 110 detects whether an electrostatic discharge event occurs at the bonding pad PAD. When detecting that an electrostatic discharge event occurs at the bounding pad PAD, the electrostatic discharge detection circuit 110 controls the discharge circuit 111 to provide a discharge path between the bounding pad PAD and the ground terminal GND, so that the electrostatic charges at the bounding pad PAD (the electrostatic discharge current) are conducted to the ground terminal GND through the discharge path, thereby protecting the elements in the core circuit 10 from being damaged by the electrostatic charges. Moreover, when detecting that an electrostatic discharge event occurs at the bonding pad PAD, the electrostatic discharge detection circuit 110 also controls the switch 112 to block the current path between the power terminal T10 and the ground terminal GND, so that no current flows through the core circuit 10, thereby preventing the one-time programmable element(s) of the core circuit 10 from being misprogrammed by the high voltage caused by the electrostatic discharge event. Various embodiments of the electrostatic discharge protection circuit 11 will be described in detail below.

Referring to FIG. 1, the electrostatic discharge detection circuit 110 comprises a resistor R10 and a capacitor C10. The resistor R10 is coupled between the power terminal T11 and the joint node ND11. The capacitor C10 is coupled between the joint node ND11 and the ground terminal GND. The discharge circuit 111 comprises a P-type transistor P10 and N-type transistors N10 and N11. In the embodiment, the P-type transistor P10 is implemented by a P-type metal-oxide-semiconductor (PMOS) transistor, and the N-type transistors N10 and N11 are implemented by N-type metal-oxide-semiconductor (NMOS) transistors. A first terminal (source) of the P-type transistor P10 is coupled to the power terminal T11, a second terminal (drain) thereof is coupled to the joint node ND11, and a control terminal (gate) thereof is coupled to the joint node ND10. A first terminal (drain) of the N-type transistor N10 is coupled to the joint node ND11, a second terminal (source) thereof is coupled to the ground terminal GND, and a control terminal (gate) thereof is coupled to the joint node ND10. According to the connection structure of the transistors P10 and N10, the transistors P10 and N10 form an inverter 113. A first terminal of the N-type transistor N11 is coupled to the power terminal T11, a second terminal thereof is coupled to the ground terminal GND, and a control terminal thereof is coupled to the joint node ND11. The switch 112 comprises an N-type transistor (such as, an NMOS transistor) N12. The first terminal of the N-type transistor N12 is coupled to the power terminal T10 of the core circuit 10, the second terminal thereof is coupled to the ground terminal GND, and the control terminal thereof is coupled to the joint node ND10.

When the core circuit 10 operates in the normal operation mode, the operation voltage VDD is supplied to the bonding pad PAD, and the ground terminal GND is at the level of a ground voltage (such as, 0 volt (V)). At this time, the detection signal S10 on the joint node ND10 has a high voltage level, that is, the joint node ND10 has a high voltage. The inverter 113 inverts the detection signal S10 with the high voltage level to generate a detection signal S11 with a low voltage level at the joint node ND11. In details, the high voltage at the joint node ND10 turns on the N-type transistor N10 and turns off the P-type transistor P10. Therefore, the detection signal S11 at the joint node ND11 has the low voltage level, that is the joint node ND11 has a low voltage (a ground voltage (0V)), to turn off the N-type transistor N11. At this time, the discharge circuit 111 does not provide any discharge path for electrostatic discharge protection. In addition, the high voltage at the joint node ND10 also turns on the N-type transistor N12 to form a current path between the power terminal T10 and the ground terminal GND. Due to the formation of the current path between the power terminal T10 and the ground terminal GND, the core circuit 10 can be programmed (written or erased) under the normal operation.

When the core circuit 10 does not operate in the normal operation mode, the operation voltage VDD is not supplied to the bonding pad PAD. When an electrostatic discharge event (such as, a positive electrostatic discharge event) occurs at the bonding pad PAD, the voltage on the power supply terminal T11 instantaneously increases. At this time, based on the element characteristics of the capacitor C10, the detection signal S10 at the joint node ND10 has a low voltage level, that is, the joint node ND10 has a low voltage. The inverter 113 inverts the detection signal S10 with the low voltage level to generate the detection signal S11 with a high voltage level at the joint node ND11. In details, the low voltage at the joint node ND10 turns on the P-type transistor P10 and turns off the N-type transistor N10. Therefore, the detection signal S11 at the joint node ND11 has the high voltage level, that is, the joint node ND11 has a high voltage to turn on the N-type transistor N11. Because the N-type transistor N11 is turned on, a discharge path is formed between the power terminal T11 and the ground terminal GND (ie, between the bonding pad PAD and the ground terminal GND), so that the electrostatic charges at the bonding pad PAD are conducted to the ground terminal GND through the discharge path, thereby protecting the elements in the core circuit 10 from being damaged by the electrostatic charges. Moreover, the low voltage at the joint node ND10 also turns off the N-type transistor N12 to block the current path between the power terminal T10 and the ground terminal GND. Since there is no current path between the core circuit 10 and the ground terminal GND, the elements in the core circuit 10 do not operate erroneously. That is, the one-time programmable element(s) in the core circuit 10 cannot be misprogrammed by the high voltage caused by the electrostatic discharge event.

Figure 2:
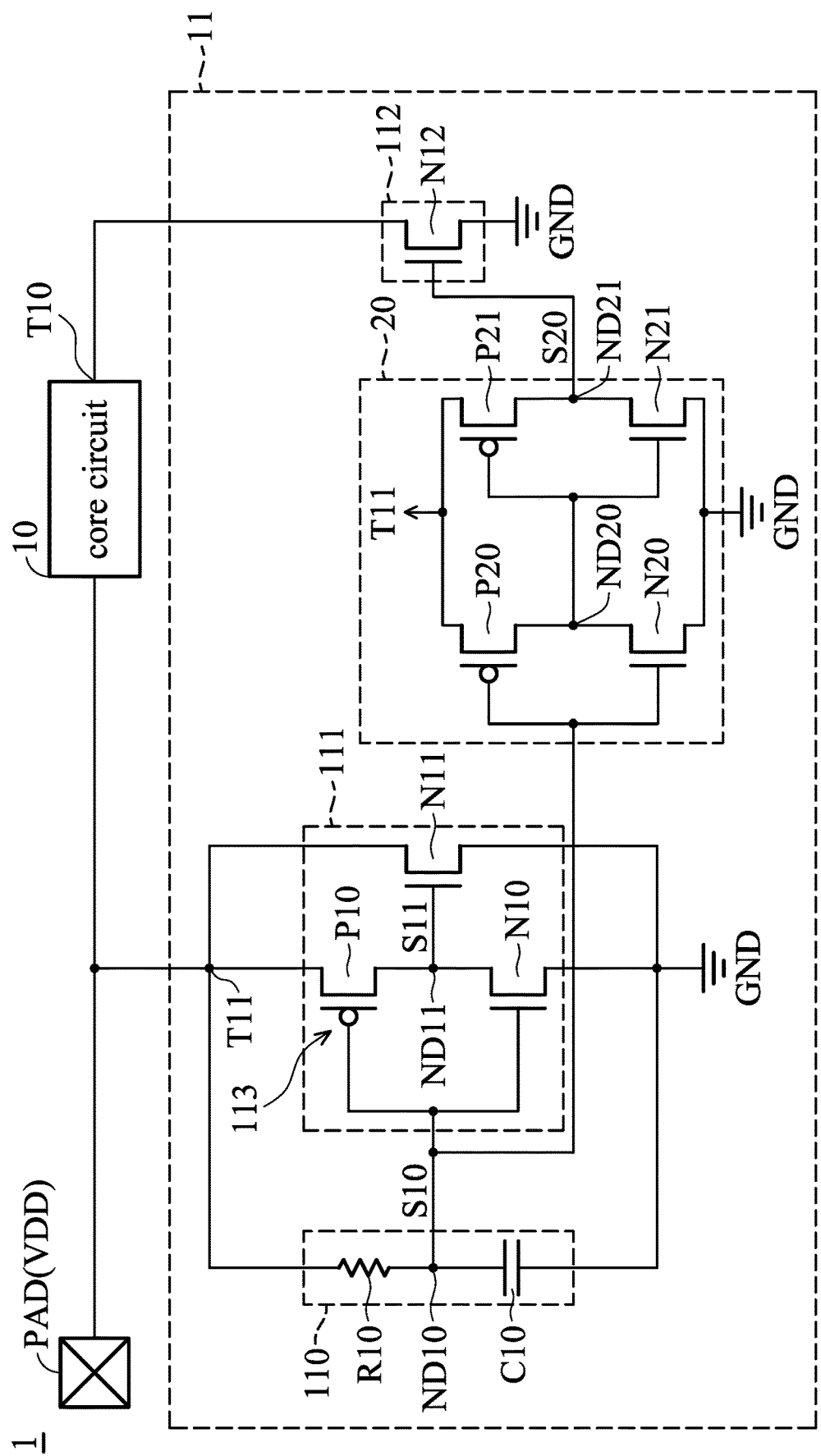
FIG. 2 shows another exemplary embodiment of an electrostatic discharge protection circuit.

In other embodiments, the electrostatic discharge protection circuit 11 further comprises a buffer 20. Referring to FIG. 2, the buffer 20 is coupled to the joint node ND10 to receive the detection signal S10. The buffer 20 buffers the detection signal S10 to generate a buffering signal S20. As shown in FIG. 2, the buffer 20 comprises N-type transistors N20 and N21 and P-type transistors P20 and P21. In the embodiment of the present invention, the P-type transistors P20 and P21 are implemented by PMOS transistors, and the N-type transistors N20 and N21 are implemented by NMOS transistors. A first terminal (source) of the P-type transistor P20 is coupled to the power terminal T11, a second terminal (drain) thereof is coupled to a joint node ND20, and a control terminal (gate) thereof is coupled to the joint node ND10. A first terminal (drain) of the N-type transistor N20 is coupled to the joint node ND20, a second terminal (source) thereof is coupled to the ground terminal GND, and a control terminal (gate) thereof is coupled to the joint node ND10. The first terminal of the P-type transistor P21 is coupled to the power terminal T11, the second terminal thereof is coupled to a joint node ND21, and the control terminal thereof is coupled to the joint node ND20. The first terminal of the N-type transistor N21 is coupled to the joint node ND21, the second terminal thereof is coupled to the ground terminal GND, and the control terminal thereof is coupled to the joint node ND20. The buffer signal S20 is generated at the joint node ND21.

When the core circuit 10 operates in the normal operation mode, the detection signal S10 at the joint node ND10 has a high voltage level, that is, the common node ND10 has a high voltage. The high voltage at the joint node ND10 turns on the N-type transistor N20 and turns off the P-type transistor P20. Therefore, the signal on the joint node ND20 has a low voltage level, that is, the joint node ND20 has a low voltage (ground voltage (0V)) to turn on the P-type transistor P21 and turn off the N-type transistor N21. At this time, the buffer signal S20 on the joint node ND21 has a high voltage level, so that the N-type transistor N12 is turned on to form a current path between the power terminal T10 and the ground terminal GND.

When the core circuit 10 does not operate in the normal operation mode, the operation voltage VDD is not supplied to the bonding pad PAD. When an electrostatic discharge event occurs at the bonding pad PAD, the voltage at the power terminal T11 instantaneously increases. At this time, based on the element characteristics of the capacitor C10, the detection signal S10 at the joint node ND10 has a low voltage level, that is, the joint node ND10 has a low voltage. The low voltage at the joint node ND10 turns on the P-type transistor P20 and turns off the N-type transistor N20. Therefore, the signal on the joint node ND20 has a high voltage level, that is, the joint node ND20 has a high voltage to turn on the N-type transistor N21 and turn off the P-type transistor P21. At this time, the buffer signal S20 on the joint node ND21 has a low voltage level, so that the N-type transistor N12 is turned off to block the current path between the power terminal T10 and the ground terminal GND. The circuit configurations and operations of the other circuits/elements in FIG. 2 are the same as the those described in the above-described embodiment of FIG. 1, and the related description thereof is omitted here.

Figure 3:
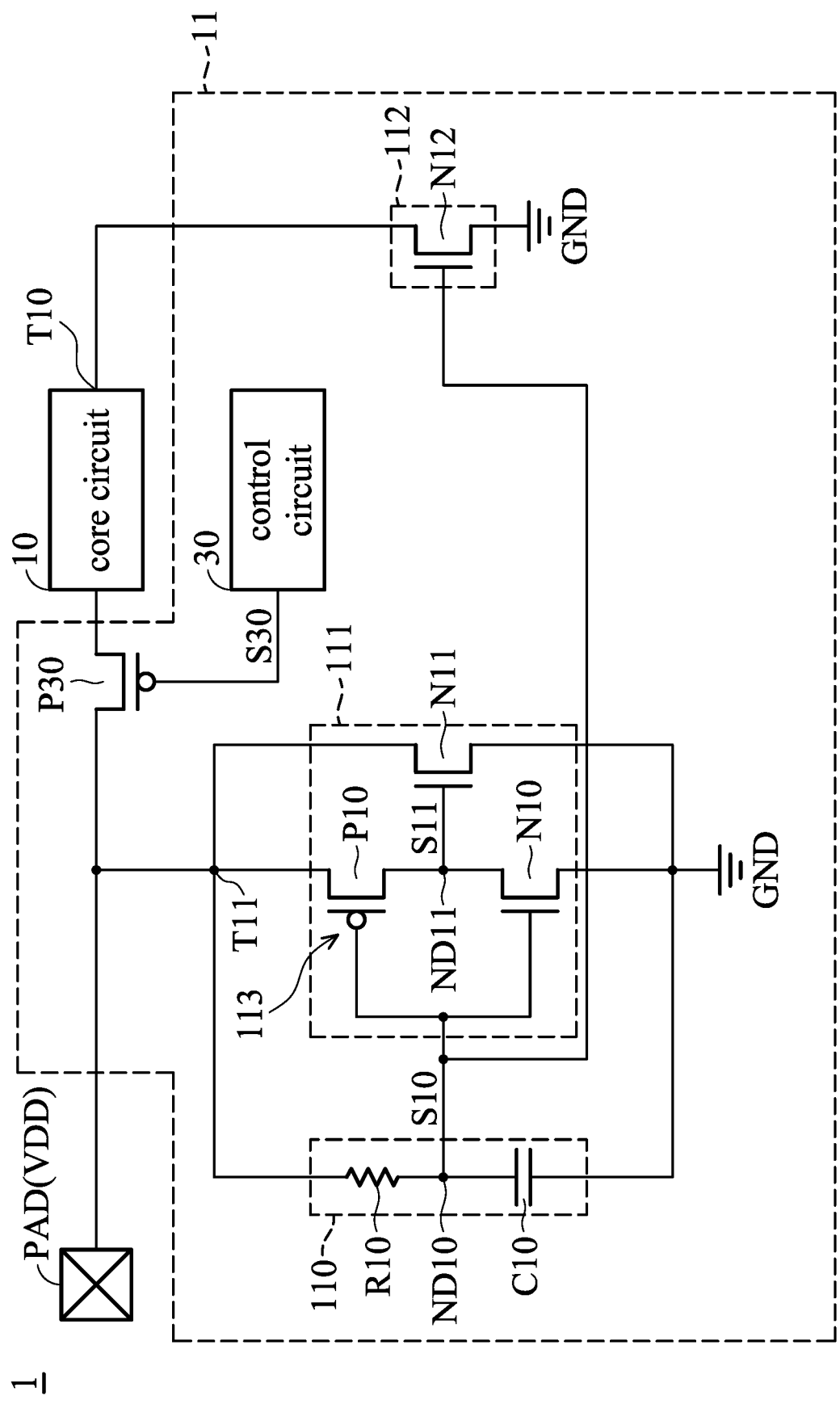
FIG. 3 shows another exemplary embodiment of an electrostatic discharge protection circuit.

Referring to FIG. 3, in some embodiments, the electrostatic discharge protection circuit 11 further compeises a P-type transistor P30 and a control circuit 30. In an embodiment of the present invention, the P-type transistor P30 is implemented by a PMOS transistor. A first terminal (source) of the P-type transistor P30 is coupled to the bonding pad PAD, a second terminal (drain) thereof is coupled to the core circuit 10, and a control terminal (gate) thereof is coupled to the control circuit 30. When the core circuit 10 operates in a normal operation mode and will be programmed, the control circuit 30 generates a control signal S30 to turn on the P-type transistor P30. When the core circuit 10 does not operate in the normal operation mode, the control circuit 30 does not operate and also does not generate the control signal S30, so that the control terminal of the P-type transistor P30 is in the floating state. When an electrostatic discharge event occurs at the bonding pad PAD, the internal resistance of the P-type transistor P30 may block the electrostatic charges from entering the core circuit 10. The circuit configurations and operations of the other circuits/elements in FIG. 3 are the same as those described in the above-described embodiment of FIG. 1, and the related description thereof is omitted here.

Figure 4:
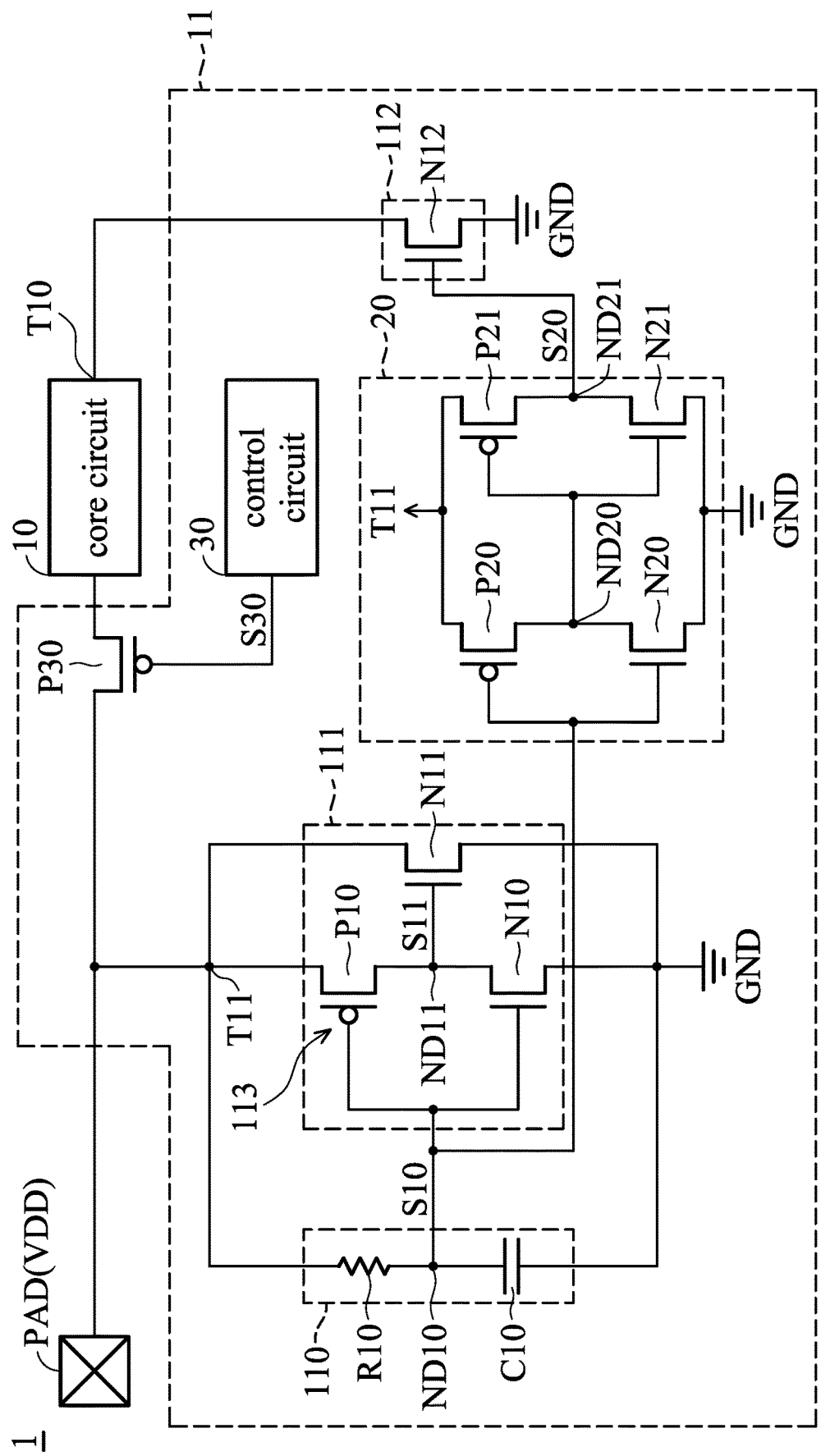
FIG. 4 shows another exemplary embodiment of an electrostatic discharge protection circuit.

Referring to FIG. 4, in some embodiments, in addition to the buffer 20, the electrostatic discharge protection circuit 11 further comprises a P-type transistor P30 and a control circuit 30. The circuit configurations and operations of the circuits/elements of the electrostatic discharge protection circuit 11 in FIG. 4 are the same as those described in the above-described embodiments of FIGS. 1-3, and the related description thereof is omitted here.

Figure 5:
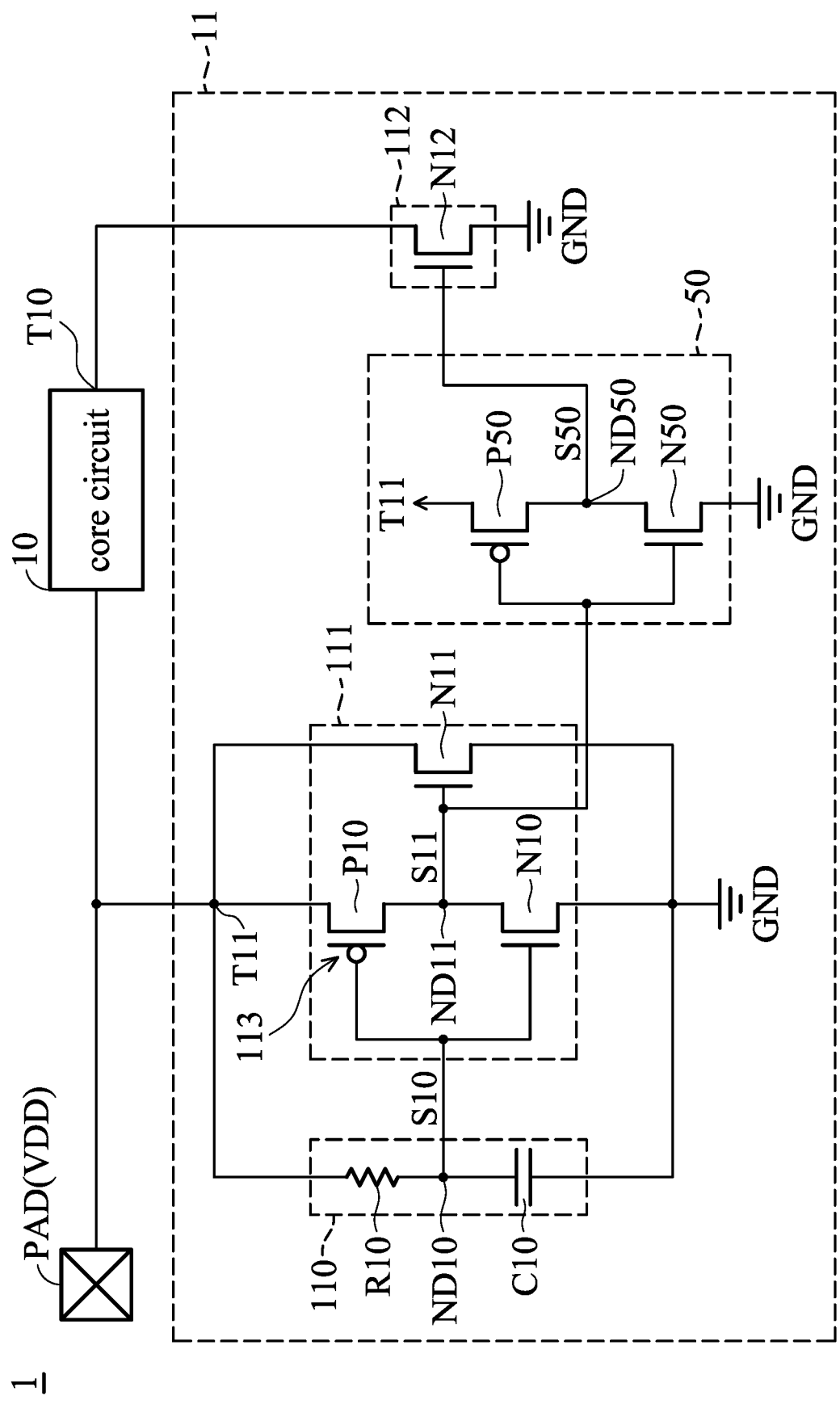
FIG. 5 shows an exemplary embodiment of an electrostatic discharge protection circuit applied in an integrated circuit.

In the above-described embodiments of FIGS. 1-2, the control terminal of the N-type transistor N12 receives the detection signal S10 or receives the buffer signal S20 obtained by buffering the detection signal S10. In other embodiments, the control terminal of the N-type transistor N12 can receive the inverted signal obtained by inverting the detection signal S11. Referring to FIG. 5, the electrostatic discharge protection circuit 11 further comprises an inverter 50 coupled between the joint node ND11 and the control terminal of the N-type transistor N12. The inverter 50 receives the detection signal S11, inverts it to generate an inverted signal S50, and then provides the inverted signal S50 to the control terminal of the N-type transistor N12. Referring to FIG. 5, the inverter 50 comprises an N-type transistor N50 and a P-type transistor P50. In an embodiment of the present invention, the P-type transistor P50 is implemented by a PMOS transistor, and the N-type transistor N50 is implemented by an NMOS transistor. A first terminal (source) of the P-type transistor P50 is coupled to the power terminal T11, a second terminal (drain) thereof is coupled to the joint node ND50, and a control terminal (gate) thereof is coupled to the joint node ND11. A first terminal (drain) of the N-type transistor N50 is coupled to a joint node ND50, a second terminal (source) thereof is coupled to the ground terminal GND, and a control terminal (gate) thereof is coupled to the joint node ND11. The inverted signal S50 is generated at the joint node ND50.

When the core circuit 10 operates in the normal operation mode, the detection signal S10 at the joint node ND10 has a high voltage level, that is, the joint node ND10 has a high voltage. Through the operation of the inverter 113, the signal S11 with a low voltage level is generated at the joint node ND11. The low voltage at the joint node ND11 turns on the P-type transistor P50 and turns off the N-type transistor N50. Therefore, the inverted signal S50 on the joint node ND50 has a high voltage level, that is, the joint node ND50 has a high voltage, so that the N-type transistor N12 is turned on to form a current path between the power terminal T10 and the ground terminal GND.

When the core circuit 10 does not operate in the normal operation mode, the operating voltage VDD is not supplied to the bonding pad PAD. When an electrostatic discharge event occurs at the bonding pad PAD, the voltage at the power terminal T11 instantaneously increases. At this time, based on the element characteristics of the capacitor C10, the detection signal S10 at the joint node ND10 has a low voltage level, that is, the joint node ND10 has a low voltage. Through the operation of the inverter 113, the signal S11 with a high voltage level is generated at the joint node ND11. The high voltage at the joint node ND11 turns on the N-type transistor N50 and turns off the P-type transistor P50. Therefore, the inverted signal S50 at the joint node ND50 has a low voltage level, that is, the joint node ND50 has a low voltage, so that the N-type transistor N12 is turned off to block the current between the power path terminal T10 and the ground terminal GND. The circuit configurations and operations of the other circuits/elements in FIG. 5 are the same as those described in the above-described embodiment of FIG. 1, and the related description thereof is omitted here.

Figure 6:
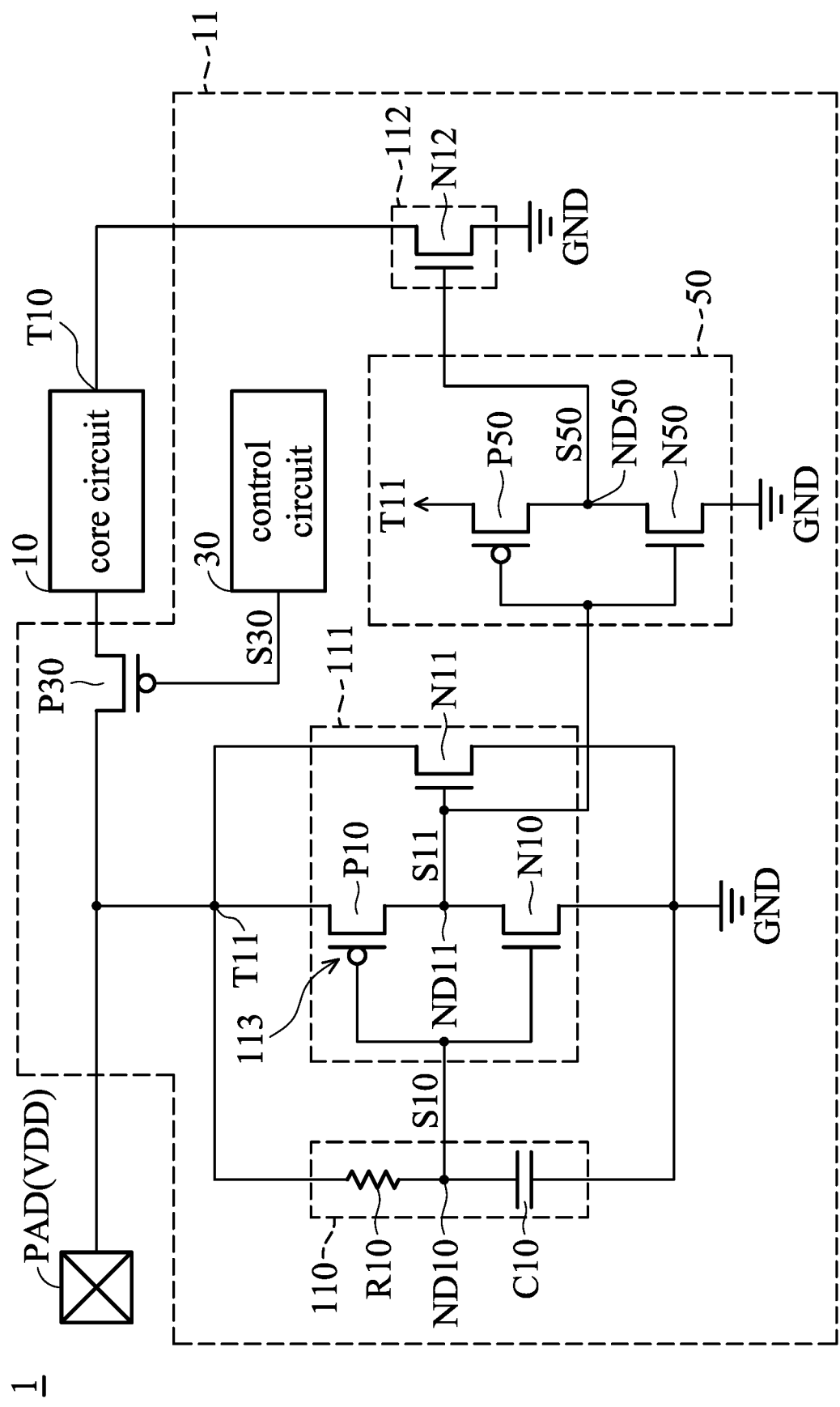
FIG. 6 shows another exemplary embodiment of an electrostatic discharge protection circuit.

In the embodiment of FIG. 3 described above, the control terminal of the N-type transistor N12 receives the detection signal S10. In other embodiments, as shown in FIG. 6, in the cases where the electrostatic discharge protection circuit 11 comprises the P-type transistor P30, the control terminal of the N-type transistor N12 can receive the inverted signal obtained by inverting the detection signal S11. Referring to FIG. 6, in comparison with the embodiment of FIG. 3, the electrostatic discharge protection circuit 11 further comprises an inverter 50. The circuit configurations and operations of the inverter 50 are the same as those described in the above-described embodiment of FIG. 5, and the related description thereof is omitted here.

Figure 7:
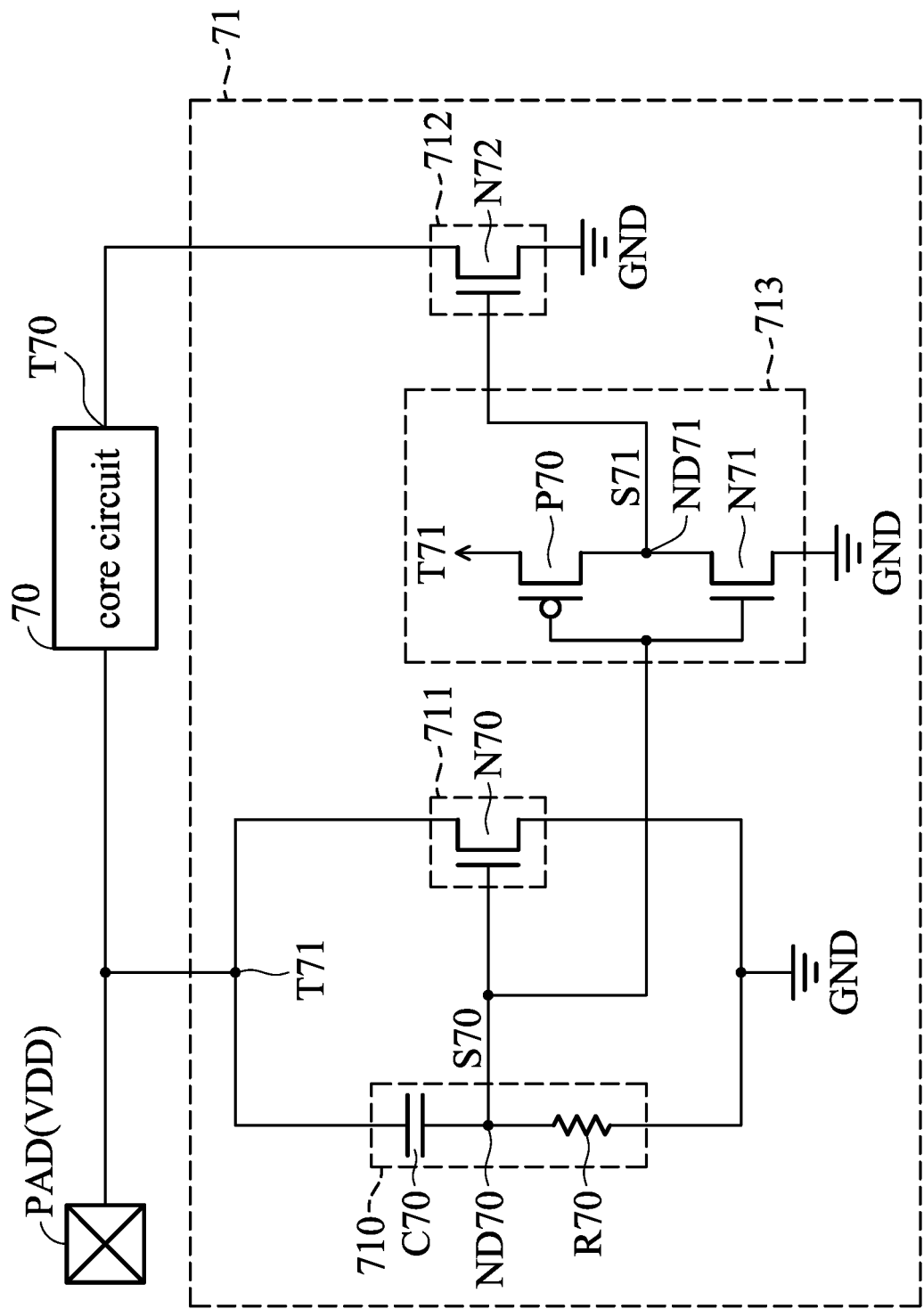
FIG. 7 shows an exemplary embodiment of an electrostatic discharge protection circuit applied in an integrated circuit.

FIG. 7 shows another exemplary embodiment of an integrated circuit. Referring to FIG. 7, the integrated circuit 7 comprises a core circuit 70, an electrostatic discharge protection circuit 71, and a bonding pad PAD. The electrostatic discharge protection circuit 71 comprises an electrostatic discharge detection circuit 710, a discharge circuit 711, a switch 712, an inverter 713, and a power supply terminal T71. The electrostatic discharge protection circuit 71 is coupled to the bonding pad PAD through the power terminal T71. The core circuit 70 is coupled to the bonding pad PAD. In an embodiment, the core circuit 70 comprises at least one one-time programmable (OTP) element. The power terminal T70 of the core circuit 70 is coupled to the ground terminal GND through the switch 712. When the core circuit 70 operates in a normal operating mode, an operation voltage VDD is provided to the bonding pad PAD; and when the core circuit 70 does not operate in the normal operation mode, the bonding pad PAD does not receive the operation voltage VDD. The electrostatic discharge detection circuit 710 is coupled to the bonding pad PAD. During periods when the core circuit 70 does not operate in the normal operation mode, the electrostatic discharge detection circuit 710 detects whether an electrostatic discharge event occurs at the bonding pad PAD. When detecting an electrostatic discharge event at the bonding pad PAD, the electrostatic discharge detection circuit 710 controls the discharge circuit 711 to provide a discharge path between the bonding pad PAD and the ground terminal GND, so that the electrostatic charges at the bonding pad PAD (the electrostatic discharge current) are conducted to the ground terminal GND through the discharge path, thereby protecting the elements in the core circuit 70 from being damaged by the electrostatic charges. Moreover, when an electrostatic discharge event occurs at the bonding pad PAD, the electrostatic discharge detection circuit 710 also controls the switch 712 to block the current path between the power terminal T70 and the ground terminal GND, so that no current flows through the core circuit 70, thereby preventing the one-time programmable element(s) of the core circuit 70 from being misprogrammed by the high voltage caused by the electrostatic discharge event. Various embodiments of the electrostatic discharge protection circuit 71 will be described in detail.

Referring to FIG. 7, the electrostatic discharge detection circuit 710 comprises a capacitor C70 and a resistor R70. The capacitor C70 is coupled between the power terminal T71 and a joint common node ND70, and the resistor R70 is coupled between the joint node ND70 and the ground terminal GND. The discharge circuit 711 comprises an N-type transistor N70. In an embodiment of the present invention, the N-type transistor N70 is implemented by an NMOS transistor. A first terminal (drain) of the N-type transistor N70 is coupled to the power terminal T71, a second terminal (source) thereof is coupled to the ground terminal GND, and a control terminal (gate) thereof is coupled to the joint node ND70. The inverter 713 is coupled between the joint node ND70 and the switch 712. The inverter 713 comprises an N-type transistor N71 and a P-type transistor P70. In an embodiment of the present invention, the P-type transistor P70 is implemented as a PMOS transistor, and the N-type transistor N71 is implemented by an NMOS transistor. A first terminal (source) of the P-type transistor P70 is coupled to the power terminal T71, a second terminal (drain) thereof is coupled to the joint node ND71, and a control terminal (gate) thereof is coupled to the joint node ND70. A first terminal (drain) of the N-type transistor N71 is coupled to the joint node ND71, a second terminal (source) thereof is coupled to the ground terminal GND, and a control terminal (gate) thereof is coupled to the joint node ND70. The switch 712 comprises an N-type transistor N72. The first terminal of the N-type transistor N72 is coupled to the power terminal T70 of the core circuit 70, the second terminal thereof is coupled to the ground terminal GND, and the control terminal thereof is coupled to the joint node ND71.

When the core circuit 70 operates in the normal operation mode, an operation voltage VDD is supplied to the bonding pad PAD, and the ground terminal GND has a ground voltage (such as, 0 volt (V)). At this time, the detection signal S70 at the joint node ND70 has a low voltage level, that is, the joint node ND70 has a low voltage to turn off the N-type transistor N70. At this time, the discharge circuit 711 does not provide any discharge path for electrostatic discharge protection. The inverter 713 inverts the detection signal S70 with the low voltage level to generate an inverted signal S71 with a high voltage level reverse at the joint node ND71. In details, the low voltage at the common node ND70 turns on the P-type transistor P70 and turns off the N-type transistor N71. Therefore, the inverted signal S71 on the common node ND71 has the high voltage level, that is, the common node ND71 has a high voltage to turn on the N-type transistor N72. Therefore, a current path is formed between the power terminal T70 and the ground terminal GND. Due to the formation of a current path between the power terminal T70 and the ground terminal GND, the core circuit 70 can be programmed (written or erased) under the normal operation.

When the core circuit 10 does not operate in the normal operation mode, the operation voltage VDD is not supplied to the bonding pad PAD. When an electrostatic discharge event (such as, a positive electrostatic discharge event) occurs at the bonding pad PAD, the voltage at the power terminal T71 instantaneously increases. At this time, based on the element characteristics of the capacitor C70, the detection signal S70 at the joint node ND70 has a high voltage level, that is, the common node ND70 has a high voltage to turn on the N-type transistor N70. Since the N-type transistor N70 is turned on, a discharge path is formed between the power terminal T71 and the ground GND (ie, between the bonding pad PAD and the ground terminal GND), so that the electrostatic charges at the bonding pad PAD are conducted to the ground terminal GND through the discharge path, thereby protecting the elements in the core circuit 70 from being damaged by the electrostatic charges. The inverter 713 inverts the detection signal S70 with the high voltage level to generate the inverted signal S71 with a low voltage level at the joint node ND71. In details, the high voltage at the joint node ND70 turns on the N-type transistor N71 and turns off the P-type transistor P70. Therefore, the inverted signal S71 at the joint node ND71 has a low voltage level, that is, the joint node ND71 has a low voltage to turn off the N-type transistor N72. The turned-off N-type transistor N72 blocks the current path between the power terminal T70 and the ground terminal GND. Since there is no current path between the core circuit 70 and the ground terminal GND, the elements in the core circuit 70 do not operate erroneously. That is, the one-time programmable element(s) cannot be misprogrammed by the high voltage caused by the electrostatic discharge event.

Figure 8:
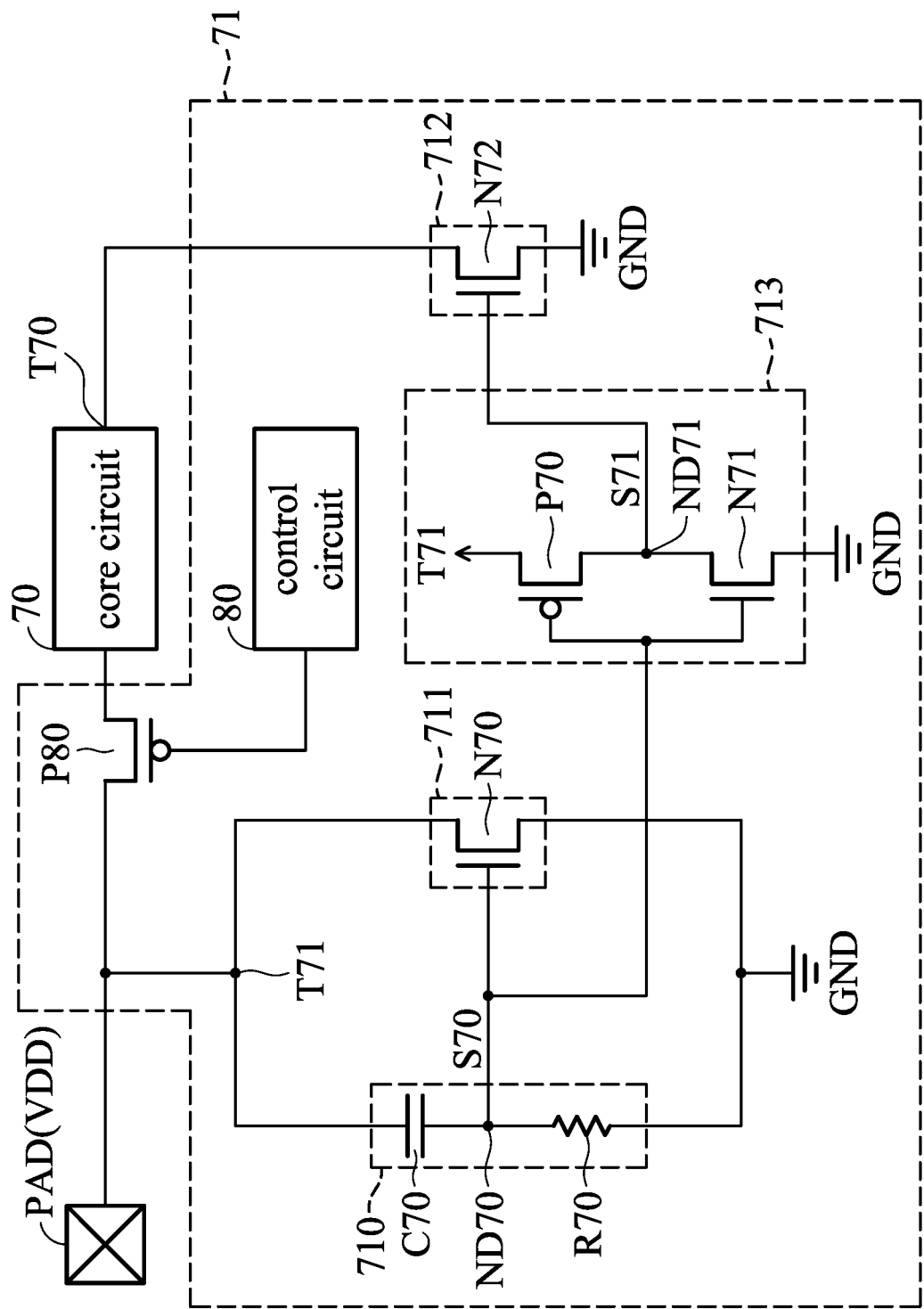
FIG. 8 shows another exemplary embodiment of an electrostatic discharge protection circuit.

In some embodiments, referring to FIG. 8, the electrostatic discharge protection circuit 71 further comprises a P-type transistor P80 and a control circuit 80. In an embodiment of the present invention, the P-type transistor P80 is implemented by a PMOS transistor. A first terminal (source) of the P-type transistor P80 is coupled to the bonding pad PAD, a second terminal (drain) thereof is coupled to the core circuit 70, and a control terminal (gate) thereof is coupled to the control circuit 80. When the core circuit 70 operates at the normal operation mode and will be programmed, the control circuit 80 generates a control signal S80 to turn on the P-type transistor P80. When the core circuit 70 does not operate at the normal operation mode, the control circuit 80 does not operate and also does not generate the control signal S80, so that the control terminal of the P-type transistor P80 is in the floating state. When an electrostatic discharge event occurs at the bonding pad PAD, the internal impedance of the P-type transistor P80 may block the static charges from entering the core circuit 80. The circuit configurations and operations of the other circuits/elements in FIG. 8 are the same as those described in the above-described embodiment of FIG. 7, and the related description thereof is omitted here.

According to the above embodiments, when an electrostatic discharge event occurs on the bonding pad. the electrostatic discharge protection circuit provided by the present invention not only provides a discharge current between the bonding pad and the ground terminal but also blocks the current path between the core circuit and the ground terminal The current path between. Accordingly, the elements in the core circuit can be protected from being damaged by the electrostatic charges and prevented from operating erroneously due to the high voltage caused by the electrostatic discharge event.

FIG. 4 shows another exemplary embodiment of the ESD protection circuit. In order to illustrate the circuit structure of the ESD protection circuit 11, FIG. 4 only shows the ESD protection circuit 11 and the pads PAD10 and PAD11. Referring to FIG. 4, the ESD protection circuit 11 comprises an ESD detection circuit 40, an inverter 41, NMOS transistors N40-N42, a power terminal T40, and a ground terminal T41. The power terminal T40 is coupled to the pad PAD10, and the ground terminal T41 is coupled to the pad PAD11. The ESD detection circuit 40 comprises a resistor R40 and a capacitor C40 which are coupled in series. The capacitor C40 is coupled between the power terminal T40 and a common node ND40. The resistor R40 is coupled between the common node ND40 and the ground T41. A signal S40 is generated at the common node ND40. The inverter 41 is coupled to the common node ND40 to receive the signal S40. The inverter 41 inverts the signal S40 to generate a signal S41 at the node ND41. The inverter 41 comprises a PMOS transistor P40 and an NMOS transistor N43. The gate (control electrode terminal) of the PMOS transistor P40 is coupled to the common node ND40, the source (electrode terminal) thereof is coupled to the power terminal T40, and the drain (electrode terminal) thereof is coupled to the node ND41. The bulk and the source of the PMOS transistor P40 are coupled together. The gate of the NMOS transistor N43 is coupled to the common node ND40, the drain thereof is coupled to the node ND41, and the source thereof is coupled to the ground terminal T41. The bulk and the source of the NMOS transistor N43 are coupled together. The gate of the NMOS transistor N40 is coupled to the node ND40 to receive the signal S40, the drain thereof is coupled to the power terminal T40, and the source thereof is coupled to the ground terminal T41. The gate and the drain of the NMOS transistor N41 are coupled together at the node ND40, and the source thereof is coupled to the bulk of the NMOS transistor N40. The bulk of the NMOS transistor N41 is coupled to the ground terminal T41. The gate of the NMOS transistor N42 is coupled to the node ND41 to receive the signal S41, the drain thereof is coupled to the node ND40 to receive the signal S40, and the source thereof is coupled to the bulk of the NMOS transistor N40. The bulk of the NMOS transistor N42 is coupled to the ground terminal T41.

When the core circuit 10 operates in the normal operation mode, an operation voltage VDD is applied to the pad PAD10, and the pad PAD11 is coupled to the ground (such as 0V). At this time, the signal S40 at the node ND40 is at a low voltage level: that is, there is a low voltage at the node ND40, to turn off the NMOS transistors N40 and N41. The inverter 41 inverts the signal S40 with the low voltage level to generate the signal S41 with a high voltage level. In detail, the low voltage at the node N40 turns off the NMOS transistor N43 and turns on the PMOS transistor P40. Thus, the signal S41 at the node ND41 is at the high voltage level: that is, there is a high voltage at the node ND41, to turn on the NMOS transistor N42. Through the turned-on NMOS transistor N42, the bulk of the NMOS transistor N40 is pulled to the low level voltage. Accordingly, both the gate and the bulk of the NMOS transistor N40 are at 0V. Thus, during the period when the core circuit 10 operates normally, the NMOS transistor N40 can be in a stable turned-off state, so that there is no leakage current path between the pads PAD10 and PAD11 in the ESD protection circuit 11, and the operation of the core circuit 10 cannot be affected by any unexpected discharge path in the ESD protection circuit 11.

When the core circuit 10 does not operate in the normal operation mode, the operation voltage VDD is not applied to the pad PAD10. When an ESD event occurs at the pad PAD10, the voltage at the power terminal T40 rises immediately. At this time, based on the element characteristics of the capacitor C40, the signal S40 at the node ND40 is at a high voltage level (that is, there is a high voltage at the node ND40) to turn on the NMOS transistors N40 and N41. The inverter 41 inverts the signal S40 with the high voltage level to generate the signal S41 with a low voltage level. In detail, the high voltage at the node ND40 turns off the PMOS transistor P40 and turns on the NMOS transistor N43. Thus, the signal S41 at the node ND41 is at the low voltage level: that is, there is a low voltage at the node ND41, to turn off the NMOS transistor N42. Due to the turned-on NMOS transistor N41, there is a voltage difference between the gate and source of the NMOS transistor N41 (the voltage difference is $V_{TH}$, $V_{TH}$ is the threshold voltage of the NMOS transistor N41). As described above, the gates of the NMOS transistors N40 and N41 are coupled together through the node ND40, and the source of the NMOS transistor N41 is coupled to the bulk of the NMOS transistor N40. In other words, the NMOS transistor N41 is coupled between the gate and bulk of the NMOS transistor N40. Thus, there is a voltage difference between the gate and bulk of the NMOS transistor N40, so the gate-bulk voltage $V_{GB}$ is not equal to zero, which ensures that the NMOS transistor N40 is turned on. Due to the turned-on NMOS transistor N40, a discharge path is formed between the power terminal T40 and the ground terminal T41 (that is, between the pads PAD10 and PAD11). Accordingly, the electrostatic charges at the pad PAD10 can be conducted to the pad PAD11 through the discharge path, thereby protecting the elements in the core circuit 10 from being damaged by the electrostatic charges.

In an embodiment, the speed of turning on the NMOS transistor N40 can be increased by raising the gate-bulk voltage of the NMOS transistor N40. Thus, the ESD protection circuit 11 may further comprise at least one NMOS transistor which is coupled to the NMOS transistor N41 in series. Referring to FIG. 5, the ESD protection circuit 11 further comprises an NMOS transistor N50. The gate and drain of the NMOS transistor N50 are coupled to the source of the NMOS transistor N41, and the source thereof is coupled to the bulk of the NMOS transistor N40. The bulk of the NMOS transistor N50 is coupled to the ground terminal T41. In the structure of FIG. 5, the source of the NMOS transistor N41 is coupled to the bulk of the NMOS transistor N40 through the NMOS transistor N50. In FIGS. 4 and 5, the elements with the same reference signs perform the same operation, thus, the related operations are omitted. In the embodiment, when the core circuit 10 does not operate in the normal operation mode and an ESD event occurs at the pad PAD10, both the NMOS transistors N41 and N50 are turned on. At this time, the gate-bulk voltage $V_{GB}$ of the NMOS transistor N40 in FIG. 5 is two times the value of $V_{TH}$, which is larger than the gate-bulk voltage $V_{GB}$ (=$V_{TH}$) of the NMOS transistor N40 in FIG. 4. Compared with the embodiment of FIG. 4, the NMOS transistor N40 in FIG. 5 can be turned on more quickly when an ESD event occurs at the pad PAD10: that is, the NMOS transistor N40 in FIG. 5 can provide a discharge path in a short time.

In the embodiment of FIG. 5, one NMOS transistor which is coupled to the NMOS transistor N41 in series is given as an example for illustration. However, in other embodiments, the number of NMOS transistors coupled to the NMOS transistor N41 in series can be determined according to the system requirements. The higher the number of NMOS transistors coupled to the NMOS transistor N41 in series is, the more the gate-bulk voltage $V_{GB}$ of the NMOS transistor N40 is, so that the NMOS transistor N40 can be turned on more quickly when an ESD event occurs at the pad PAD10.

In the above embodiments, the transistors which provide the discharge paths are implemented by NMOS transistors. In other embodiments, PMOS transistors can be used to provide discharge paths. FIG. 6 shows another exemplary embodiment of the ESD protection circuit. Referring to FIG. 6, the ESD protection circuit 11 comprises an ESD detection circuit 60, an inverter 61, PMOS transistors P60-P62, a power terminal T60, and a ground terminal T61. The power terminal T60 is coupled to the pad PAD10, and the ground terminal T61 is coupled to the pad PAD11. The ESD detection circuit 60 comprises a resistor R60 and a capacitor C60 which are coupled in series. The capacitor C60 is coupled between the power terminal T60 and a common node ND60. The resistor R60 is coupled between the common node ND60 and the ground T61. When the core circuit 10 does not operate in the normal operation mode, the operation voltage VDD is not applied to the pad PAD10.

When an ESD event occurs at the pad PAD10, the voltage at the power terminal T60 rises immediately. At this time, based on the element characteristics of the capacitor C60, the signal S60 at the node ND60 is at a high voltage level (that is, there is a high voltage at the node ND60) to turn off the PMOS transistor P62. The inverter 61 inverts the signal S60 with the high voltage level to generate the signal S61 with a low voltage level. In detail, the high voltage at the node ND60 turns off the PMOS transistor P63 and turns on the NMOS transistor N60. Thus, the signal S61 at the node ND61 is at the low voltage level: that is, there is a low voltage (0V) at the node ND61, to turn on the PMOS transistors P60 and P61. Due to the turned-on PMOS transistor P61, there is a voltage difference between the gate and drain of the PMOS transistor P61 (the voltage difference is $V_{TH}$, $V_{TH}$ is the threshold voltage of the PMOS transistor P61). As described above, the gates of the PMOS transistors P60 and P61 are coupled together through the node ND61, and the drain of the PMOS transistor P61 is coupled to the bulk of the PMOS transistor P60. In other words, the PMOS transistor P61 is coupled between the gate and bulk of the PMOS transistor P60. Thus, there is a voltage difference between the gate and bulk of the PMOS transistor P60, so the gate-bulk voltage $V_{GB}$ is not equal to zero, which ensures that the PMOS transistor P60 is turned on. Due to the turned-on PMOS transistor P60, a discharge path is formed between the power terminal T60 and the ground terminal T61 (that is, between the pads PAD10 and PAD11). Accordingly, the electrostatic charges at the pad PAD10 can be conducted to the pad PAD11 through the discharge path, thereby protecting the elements in the core circuit 10 from being damaged by the electrostatic charges.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit coupled to a bounding pad and a core circuit, comprising:
   an electrostatic discharge detection circuit detecting whether an electrostatic discharge event occurs at the bounding pad to generate a first detection signal;
   a discharge circuit receiving the first detection signal, wherein when the electrostatic discharge event occurs at the bounding pad, the discharge circuit provides a discharge path between the bounding pad and a ground terminal according to the first detection signal;
   a switch coupled between the core circuit and the ground terminal and controlled by the first detection signal, wherein when the electrostatic discharge event occurs at the bounding pad, the switch is turned off according to the first detection signal; and
   a first P-type transistor having a first terminal coupled to the bounding pad, a second terminal coupled to the core circuit, and a control terminal,
   wherein when the core circuit does not operate in a normal operation mode, the control terminal of the first P-type transistor is in a floating state.

2. The electrostatic discharge protection circuit as claimed in claim 1, wherein the core circuit operates in the normal operation mode, the control terminal of the first P-type transistor receives a control signal.

3. The electrostatic discharge protection circuit as claimed in claim 1, wherein the switch comprises:
an N-type transistor having a first terminal coupled to the core circuit, a second terminal coupled to the ground terminal, and a control terminal receiving the first detection signal.

4. The electrostatic discharge protection circuit as claimed in claim 1 further comprising:
a buffer, coupled between the electrostatic discharge detection circuit and the switch, receiving the first detection signal, generating a buffering signal according to the first detection signal, and providing the buffering signal to the switch,
wherein when the electrostatic discharge event occurs at the bounding pad, the switch is turned off according to the buffering signal.

5. The electrostatic discharge protection circuit as claimed in claim 4, wherein the buffer circuit comprises:
a second P-type transistor having a first terminal coupled to the bounding terminal, a second terminal coupled to a first node, and a control terminal receiving the first detection signal;
a first N-type transistor having a first terminal coupled to the first node, a second terminal coupled to the ground terminal, and a control terminal receiving the first detection signal;
a third P-type transistor having a first terminal coupled to the bounding terminal, a second terminal coupled to a second node, and a control terminal coupled to the first node; and
a second N-type transistor having a first terminal coupled to the second node, a second terminal coupled to the ground terminal, and a control terminal coupled to the first node;
wherein the buffering signal is generated at the second node.

6. The electrostatic discharge protection circuit as claimed in claim 1, wherein the discharge circuit generates a second detection signal which is inverse to the first detection signal, and the electrostatic discharge protection circuit further comprises:
an inverter, coupled between the discharge circuit and the switch, receiving the second detection signal, generating an inverted signal according to the second detection signal, and providing the inverted signal to the switch,
wherein when the electrostatic discharge event occurs at the bounding pad, the switch is turned off according to the inverted signal.

7. The electrostatic discharge protection circuit as claimed in claim 1, further comprising:
an inverter, coupled between the electrostatic discharge detection circuit and the switch, receiving the first detection signal, generating an inverted signal according to the first detection signal, and providing the inverted signal to the switch,
wherein when the electrostatic discharge event occurs at the bounding pad, the switch is turned off according to the inverted signal.

8. The electrostatic discharge protection circuit as claimed in claim 7, wherein the electrostatic discharge detection circuit comprises:
a capacitor coupled between the bounding pad and a first node; and
a resistor coupled between the first node and the ground terminal,
wherein the first detection signal is generated at the first node.

9. An integrated circuit comprising:
a core circuit, coupled to a bounding pad, having a power terminal coupled to a ground terminal; and
an electrostatic discharge protection circuit coupled to the bounding pad and the core circuit, wherein when an electrostatic discharge event occurs at the bounding pad, the electrostatic discharge protection circuit provides a discharge path between the bounding pad and the ground terminal and blocks a current path between the power terminal the ground terminal, and wherein the electrostatic discharge protection circuit comprises:
an electrostatic discharge detection circuit detecting whether the electrostatic discharge event occurs at the bounding pad to generate a first detection signal;
a discharge circuit receiving the first detection signal, wherein when the electrostatic discharge event occurs at the bounding pad, the discharge circuit provides the discharge path according to the first detection signal;
a first N-type transistor having a first terminal coupled to the core circuit, a second terminal coupled to the ground terminal, and a control terminal receiving the first detection signal and;
a first P-type transistor having a first terminal coupled to the bounding pad, a second terminal coupled to the core circuit, and a control terminal,
wherein when the electrostatic discharge event occurs at the bounding pad, the first N-type transistor is turned off according to the first detection signal to block the current path, and
wherein when the core circuit does not operate in a normal operation mode, the control terminal of the first P-type transistor is in a floating state.

10. The integrated circuit as claimed in claim 9, wherein the core circuit operates in the normal operation mode, the control terminal of the first P-type transistor receives a control signal.

11. The integrated circuit as claimed in claim 9, wherein the electrostatic discharge protection circuit further comprises:
a buffer, coupled between the electrostatic discharge detection circuit and the control terminal of the first N-type transistor, receiving the first detection signal, generating a buffering signal according to the first detection signal, and providing the buffering signal to the control terminal of the first N-type transistor,
wherein when the electrostatic discharge event occurs at the bounding pad, the first N-type transistor is turned off according to the buffering signal to block the current path.

12. The integrated circuit as claimed in claim 11, wherein the buffer circuit comprises:
a second P-type transistor having a first terminal coupled to the bounding terminal, a second terminal coupled to a first node, and a control terminal receiving the first detection signal;
a second N-type transistor having a first terminal coupled to the first node, a second terminal coupled to the ground terminal, and a control terminal receiving the first detection signal;
a third P-type transistor having a first terminal coupled to the bounding terminal, a second terminal coupled to a second node, and a control terminal coupled to the first node; and a third N-type transistor having a first terminal coupled to the second node, a second terminal coupled to the ground terminal, and a control terminal coupled to the first node;

wherein the buffering signal is generated at the second node.

13. The integrated circuit as claimed in claim 9, wherein the discharge circuit generates a second detection signal which is inverse to the first detection signal, and the electrostatic discharge protection circuit further comprises:

an inverter, coupled between the discharge circuit and the control terminal of the first N-type transistor, receiving the second detection signal, generating an inverted signal according to the second detection signal, and providing the inverted signal to the control terminal of the first N-type transistor, wherein when the electrostatic discharge event occurs at the bounding pad, the first N-type transistor is turned off according to the inverted signal to block the current path.

14. The integrated circuit as claimed in claim 9, wherein the electrostatic discharge protection circuit further comprises:

an inverter, coupled between the electrostatic discharge detection circuit and the control terminal of the first N-type transistor, receiving the first detection signal, generating an inverted signal according to the first detection signal, and providing the inverted signal to the control terminal of the first N-type transistor, wherein when the electrostatic discharge event occurs at the bounding pad, the first N-type transistor is turned off according to the inverted signal to block the current path.

15. The integrated circuit as claimed in claim 14, wherein the electrostatic discharge detection circuit comprises:

a capacitor coupled between the bounding pad and a first node; and a resistor coupled between the first node and the ground terminal, wherein the first detection signal is generated at the first node.

* * * * *